(12) United States Patent
Koo et al.

(10) Patent No.: US 9,754,994 B2
(45) Date of Patent: Sep. 5, 2017

(54) IMAGE SENSORS INCLUDING CONDUCTIVE PIXEL SEPARATION STRUCTURES AND METHODS OF FABRICATING THE SAME

(71) Applicant: Samsung Electronics Co., Ltd., Suwon-si, Gyeonggi-do (KR)

(72) Inventors: Junemo Koo, Seoul (KR); Namgil Kim, Bucheon-si (KR); Changrok Moon, Seoul (KR); Byungjun Park, Yongin-si (KR); Jongcheol Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/349,227

(22) Filed: Nov. 11, 2016

(65) Prior Publication Data
US 2017/0062513 A1    Mar. 2, 2017

Related U.S. Application Data

(63) Continuation of application No. 14/191,670, filed on Feb. 27, 2014, now Pat. No. 9,524,995.

(30) Foreign Application Priority Data

Mar. 4, 2013    (KR) .................. 10-2013-0022858

(51) Int. Cl.
H01L 27/146    (2006.01)

(52) U.S. Cl.
CPC .... *H01L 27/14689* (2013.01); *H01L 27/1463* (2013.01); *H01L 27/1464* (2013.01); *H01L 27/14614* (2013.01); *H01L 27/14623* (2013.01); *H01L 27/14636* (2013.01)

(58) Field of Classification Search
CPC ......... H01L 27/14689; H01L 27/14614; H01L 27/14623
See application file for complete search history.

(56) References Cited

U.S. PATENT DOCUMENTS

| | | | |
|---|---|---|---|
| 6,218,691 B1 | 4/2001 | Chung et al. | |
| 7,902,618 B2 | 3/2011 | Mao et al. | |
| 8,035,178 B2 | 10/2011 | Mori et al. | |
| 8,138,530 B2 | 3/2012 | Park et al. | |
| 9,006,807 B2 * | 4/2015 | Inoue .................. | H01L 31/0224 257/291 |

(Continued)

FOREIGN PATENT DOCUMENTS

| | | |
|---|---|---|
| JP | 2007-036118 | 2/2007 |
| JP | 2008-084962 | 4/2008 |

(Continued)

*Primary Examiner* — Errol Fernandes
(74) *Attorney, Agent, or Firm* — Ward and Smith, P.A.

(57) ABSTRACT

An image sensor includes a substrate having adjacent pixel regions and respective photodiode regions therein, and a pixel separation portion including a trench extending into the substrate between the adjacent pixel regions. The trench includes a conductive common bias line therein and an insulating device isolation layer between the common bias line and surfaces of the trench. A conductive interconnection is coupled to the common bias line and is configured to provide a negative voltage thereto. Related fabrication methods are also discussed.

11 Claims, 29 Drawing Sheets

(56) References Cited

U.S. PATENT DOCUMENTS

| | | |
|---|---|---|
| 2007/0052056 A1 | 3/2007 | Doi et al. |
| 2007/0194356 A1 | 8/2007 | Moon et al. |
| 2008/0217719 A1 | 9/2008 | Liu et al. |
| 2008/0311715 A1 | 12/2008 | Hu et al. |
| 2009/0315132 A1 | 12/2009 | Kohyama |
| 2010/0096718 A1 | 4/2010 | Hynecek et al. |
| 2010/0193845 A1 | 8/2010 | Roy et al. |
| 2010/0237451 A1 | 9/2010 | Murakoshi |
| 2012/0025199 A1 | 2/2012 | Chen et al. |
| 2012/0261732 A1 | 10/2012 | Marty et al. |
| 2012/0261783 A1 | 10/2012 | Prima et al. |
| 2013/0113969 A1 | 5/2013 | Manabe et al. |
| 2013/0285181 A1 | 10/2013 | Lin et al. |

FOREIGN PATENT DOCUMENTS

| | | |
|---|---|---|
| KR | 1020040058689 | 7/2004 |
| KR | 1020040058753 | 7/2004 |
| KR | 1020060093385 | 8/2006 |
| KR | 100730469 | 6/2007 |
| KR | 1020080014301 | 2/2008 |
| KR | 1020110049329 | 5/2011 |

\* cited by examiner

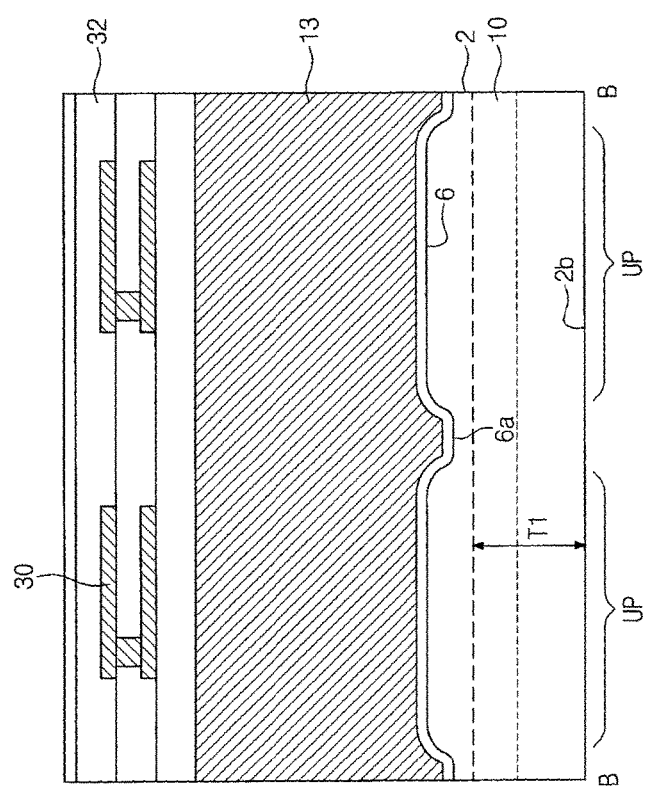

IMAGE SENSORS INCLUDING CONDUCTIVE PIXEL SEPARATION STRUCTURES AND METHODS OF FABRICATING THE SAME

CROSS-REFERENCE TO RELATED APPLICATIONS

The present application is a continuation application of and claims priority from U.S. patent application Ser. No. 14/191,670, filed on Feb. 27, 2014, and claims priority under 35 U.S.C. §119 to Korean Patent Application No. 10-2013-0022858, filed on Mar. 4, 2013, in the Korean Intellectual Property Office, the entire contents of which are hereby incorporated by reference.

BACKGROUND

Example embodiments of the inventive concept relate to image sensors and methods of forming the same.

Image sensors are semiconductor devices capable of converting electric signals into optical images. Image sensors may be classified into various types, including charge coupled device (CCD) type and complementary metal oxide semiconductor (CMOS) type. A CMOS image sensor (CIS) may include pixels arranged in two dimensions. Each of the pixels may include a photodiode (PD), which converts incident light into electric signal.

As semiconductor devices become more highly integrated, image sensors may likewise become highly integrated. Accordingly, the corresponding pixels may be scaled down, such that cross talk may increasingly occur between pixels.

SUMMARY

Example embodiments of the inventive concept provide highly-integrated image sensors capable of improving dark current properties and methods of fabricating the same.

According to example embodiments of the inventive concepts, an image sensor includes a substrate having adjacent pixel regions comprising respective photodiode regions therein, and a pixel separation portion comprising trench extending into the substrate between the adjacent pixel regions. The trench includes a conductive common bias line therein and an insulating device isolation layer between the common bias line and surfaces of the trench. A conductive interconnection is coupled to the common bias line and is configured to provide a voltage thereto.

In example embodiments, the trench including the common bias line therein may define a grid including the pixel regions therebetween in plan view.

In example embodiments, the trench including the common bias line therein may not extend completely through the substrate. The pixel separation portion may further include a channel stop region between the insulating device isolation layer in the trench and a surface of the substrate. The channel stop region has a conductivity type opposite to that of the respective photodiode regions.

In example embodiments, the surface of the substrate may be a light-receiving surface adjacent the respective photodiode regions. The channel stop region may continuously extend from the insulating device isolation layer in the trench to the surface of the substrate.

In example embodiments, the trench may have differing depths such that the common bias line therein has a non-planar surface. A distance from the surface of the substrate to the insulating device isolation layer in the trench may be greater in portions of the trench separating two of the adjacent pixel regions than in portions of the trench defining an intersection between four of the adjacent pixel regions.

In example embodiments, the surface of the substrate may be opposite a light-receiving surface thereof.

In example embodiments, the pixel separation portion may further include a shallow trench isolation region between the channel stop region and the surface of the substrate. The channel stop region may continuously extend from the insulating device isolation layer in the trench to the shallow trench isolation region. A depth of the shallow trench isolation region may be less than that of the insulating device isolation region.

According to further example embodiments of the inventive concepts, an image sensor may include a substrate, in which a plurality of pixel regions are provided and which has a first surface and a second surface facing or opposite each other, a photoelectric conversion part formed in each of the pixel regions of the substrate, a gate electrode provided on the photoelectric conversion part, and a pixel separation portion provided in the substrate to separate the pixel regions from each other. The pixel separation portion may include a deep device isolation layer and a common bias line provided in the deep device isolation layer, and the common bias line may be configured to be applied with a negative voltage. Here, light may be incident into the image sensor through the second surface.

In example embodiments, in plan view, the common bias line may have a mesh shape.

In example embodiments, the common bias line may have a curved top or bottom surface.

In example embodiments, the common bias line may be electrically isolated from the substrate.

In example embodiments, the common bias line may have a bottom surface positioned adjacent to the first surface and electrically connected to an external-voltage-applying wire. Alternatively, the common bias line may have a top surface positioned adjacent to the second surface and electrically connected to an external-voltage-applying wire.

In example embodiments, the substrate may further include an optical black region provided spaced apart from the pixel regions, and the image sensor may further include an optical black pattern provided on the optical black region. The optical black pattern and the external-voltage-applying wire include the same material.

In example embodiments, the substrate may further include a pad region provided spaced apart from the pixel region, and the image sensor may further include a through via provided through the pad region. The through via and the external-voltage-applying wire include the same material.

In example embodiments, the pixel separation portion may further include a channel-stop region in contact with the deep device isolation layer.

In example embodiments, the image sensor may further include a shallow device isolation layer that is provided in contact with the first surface and spaced apart from the deep device isolation layer. The shallow device isolation layer may have a depth smaller than that of the deep device isolation layer. The channel-stop region may be provided between the deep device isolation layer and the shallow device isolation layer.

According to example embodiments of the inventive concepts, a method of fabricating an image sensor may include forming a pixel separation portion in a substrate to define pixel regions. The substrate may have a first surface and a second surface facing each other. Thereafter, a photoelectric conversion part and a gate electrode may be formed in or on each of the pixel regions. The pixel separation portion may be formed to include a deep device isolation layer and a common bias line that is provided in the deep device isolation layer and is applied with a negative voltage. Here, light may be incident into the image sensor through the second surface.

In example embodiments, the forming of the pixel separation portion may include etching a portion of the substrate adjacent to the first surface to form a deep trench, forming the deep device isolation layer to cover conformally side and bottom surface of the deep trench, and forming the common bias line to fill the deep trench.

In example embodiments, the forming of the pixel separation portion may include etching a portion of the substrate adjacent to the second surface to form a deep trench, forming the deep device isolation layer to cover conformally side and bottom surface of the deep trench, and forming the common bias line to fill the deep trench.

In example embodiments, the substrate may further include an optical black region spaced apart from the pixel regions. In this case, the method may further include forming an insulating layer to cover the second surface, and forming an optical black pattern in the insulating layer on the optical black region and an external-voltage-applying wire connected to the common bias line. The optical black pattern and the external-voltage-applying wire may be formed using the same process.

In example embodiments, the substrate may further include a pad region spaced apart from the pixel regions. In this case, the method may further include forming an insulating layer to cover the second surface, and forming a through via and an external-voltage-applying wire. The through via may be formed to penetrate the insulating layer and the pad region of the substrate, and the external-voltage-applying wire may be connected to the common bias line. The through via and the external-voltage-applying wire may be formed using the same process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A through 9A are sectional views taken parallel to the line A-A' of FIG. 2 to illustrate a process of fabricating the image sensor of FIG. 2.

FIGS. 4B through 9B are sectional views taken parallel to the line B-B' of FIG. 2 to illustrate a process of fabricating the image sensor of FIG. 2.

Figure 1:
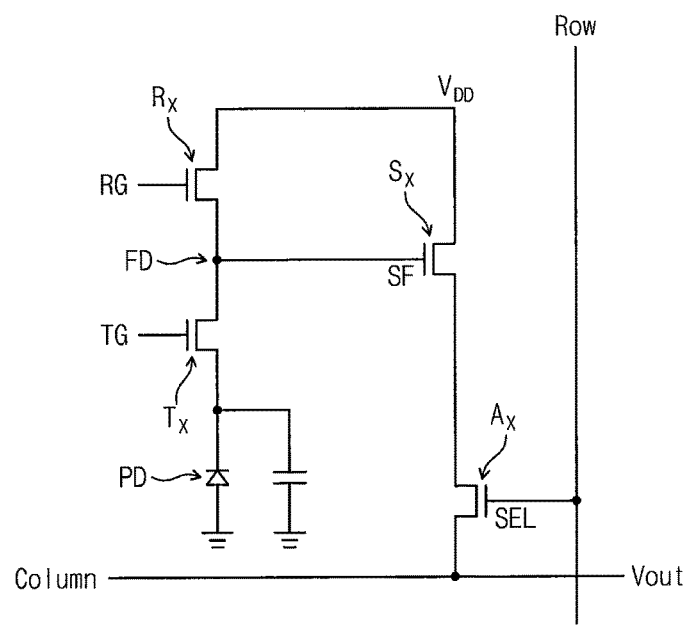
FIG. 1 is a circuit diagram of an image sensor according to example embodiments of the inventive concept

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted. As used herein the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram of an image sensor according to example embodiments of the inventive concept.

Referring to FIG. 1, the image sensor may include a plurality of unit pixels, each of which includes a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively. A photoelectric conversion portion may be provided in the photoelectric conversion region PD. The photoelectric conversion portion may be a photodiode including an n-type impurity region and a p-type impurity region. The transfer transistor Tx may include a drain region serving as a floating diffusion region FD. The floating diffusion region FD may also serve as a source region of the reset transistor Rx. The floating diffusion region FD may be electrically connected to the source follower gate SF of the source follower transistor Sx. The source follower transistor Sx may be connected to the selection transistor Ax. The reset transistor Rx, the source follower transistor Sx, and the selection transistor Ax may be shared by adjacent pixels, and this makes it possible to increase an integration density of the image sensor.

Hereinafter, an operation of the image sensor will be described with reference to FIG. 1. In particular, when in a light-blocking state, a power voltage VDD may be applied to a drain region of the reset transistor Rx and a drain region of the source follower transistor Sx to turn on the reset transistor Rx and discharge electric charges from the floating diffusion region FD. Thereafter, if the reset transistor Rx is turned-off and external light is incident into the photoelectric conversion region PD, electron-hole pairs may be generated in the photoelectric conversion region PD. Holes may be moved toward the p-type doped region, and electrons may be moved toward and accumulated in the n-type doped region. If the transfer transistor Tx is turned on, the electric charges (e.g., electrons) may be transferred to and accumulated in the floating diffusion region FD. A change in amount of the accumulated charges may lead to a change in gate bias of the source follower transistor Sx, and this may lead to a change in source potential of the source follower transistor Sx. Accordingly, if the selection transistor Ax is turned on, an amount of the charges may be transmitted or read out as a signal through a column line.

Figure 2:
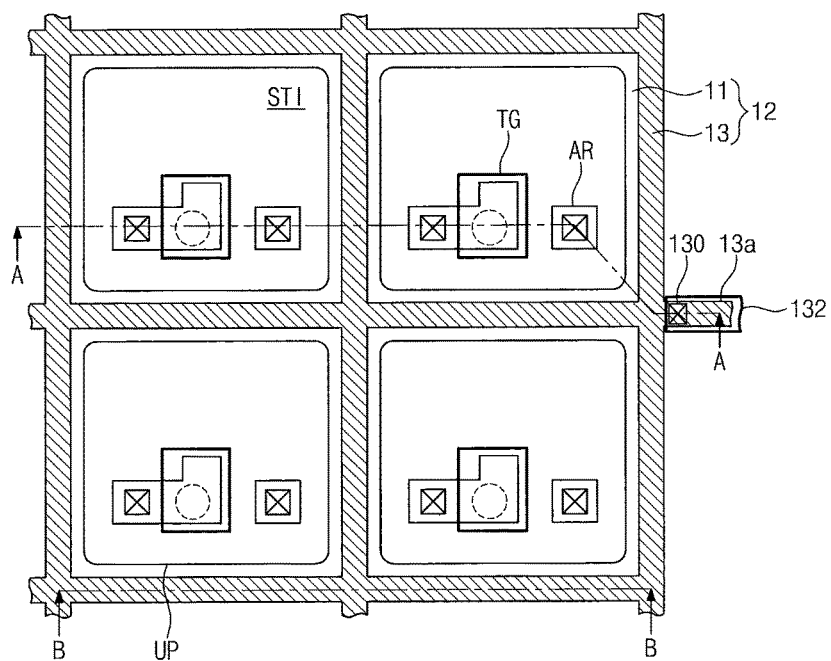
FIG. 2 is a layout illustrating an image sensor according to example embodiments of the inventive concept.
Figure 3A:
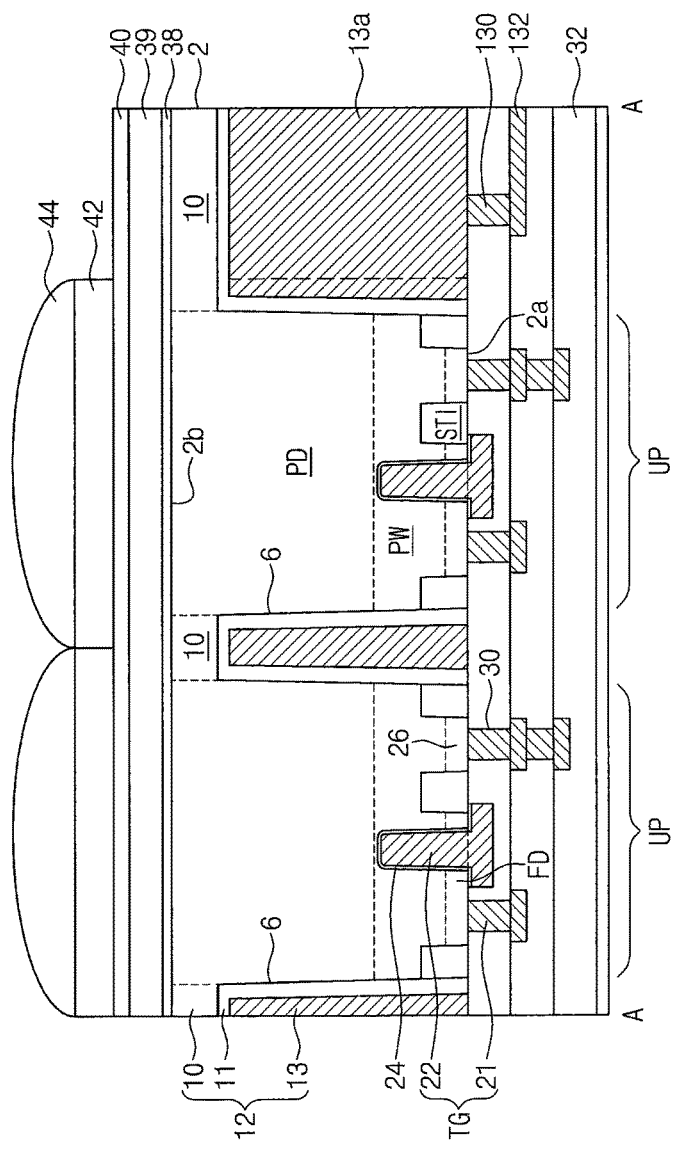
FIGS. 3A and 3B are sectional views taken along lines A-A' and B-B', respectively, of FIG. 2.
Figure 3B:
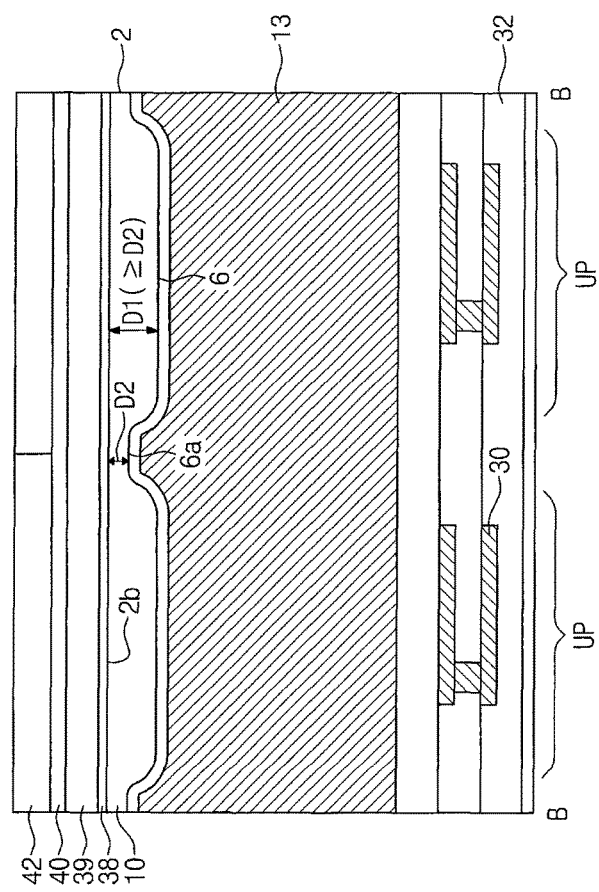

FIG. 2 is a layout illustrating an image sensor according to example embodiments of the inventive concept, FIGS. 3A and 3B are sectional views taken along lines A-A' and B-B', respectively, of FIG. 2.

Referring to FIGS. 1, 2, 3A and 3B, a substrate 2 may be provided to include unit pixel regions UP. The substrate 2 may be a silicon wafer, a silicon-on-insulator (SOI) substrate, or a substrate including a semiconductor epitaxial layer. The substrate 2 may include a first surface 2a and a second surface 2b opposite each other. The second surface 2b may be arranged or configured in the image sensor such that light may be incident thereon, and is also referred to herein as a light-receiving surface 2b.

A pixel separation portion 12 may be provided in the substrate 2 to separate the unit pixel regions UP from each other. In plan view, the pixel separation portion 12 may be shaped like a mesh or grid. In example embodiments, the pixel separation portion 12 may have a height that is substantially equivalent to a thickness of the substrate 2. The pixel separation portion 12 may be formed through the substrate 2 to connect or otherwise extend between the first and second surfaces 2a and 2b. The pixel separation portion 12 may include an insulating deep device isolation layer 11 and a conductive common bias line 13 therein. The deep device isolation layer 11 and the common bias line 13 may be in contact with each other. The pixel separation portion 12 may further include a channel-stop region 10 that is in contact with the deep device isolation layer 11. The deep device isolation layer 11 may be formed of an insulating material, whose refractive index is different from that of the substrate 2. For example, the deep device isolation layer DTI may be formed of at least one of a silicon oxide layer, a silicon nitride layer, or a silicon oxynitride layer. In the present embodiment, the deep device isolation layer 11 may be provided in contact with the first surface 2a and spaced apart from the second surface 2b. A top surface of the deep device isolation layer 11 adjacent to the second surface 2b may have a curved or uneven structure. A distance from the second surface 2b to a top surface 6 of the deep device isolation layer 11 may be a first distance D1 between two adjacent pixel regions UP, and a second distance D2 (which is less than or equal to D1) at an intersection of four adjacent pixel regions UP.

The common bias line 13 may be formed of at least one of an undoped or doped polysilicon layer, a metal silicide layer, or a metal-containing layer. Since the deep device isolation layer 11 has the curved or uneven top surface, the common bias line 13 may have a curved or uneven top surface. A line-shaped edge or linear portion 13a may be provided at an end portion of the common bias line 13. The line-shaped edge 13a may be electrically connected to an edge contact 130 and an external-voltage-applying wire 132 that are provided adjacent to the first surface 2a. The common bias line 13 may be applied with a negative voltage via the external-voltage-applying wire 132. The negative voltage applied to the common bias line 13 may fix or attract holes to a surface of the deep device isolation layer 11, and this makes it possible to improve a dark current property of the image sensor.

The channel-stop region 10 may be in contact with the second surface 2b. For example, the photoelectric conversion part PD may be doped with n-type impurities, and the channel-stop region 10 may be doped with p-type impurities. Since the pixel separation portion 12 is formed to penetrate and extend through the substrate 2 from the first surface 2a to the second surface 2b, each of the unit pixel regions UP can be electrically or optically isolated from the others, and thus, it is possible to reduce or prevent cross talk between the unit pixel regions UP from occurring by a slantingly incident light (that is, in response to incident light at oblique angles relative to the light-receiving surface 2b). Further, the photoelectric conversion part PD may be formed to be in contact with the sidewall of the pixel separation portion 12 and may have the same area as the unit pixel region UP, which can allow the image sensor to have an increased light-receiving area and/or an increased fill factor.

A plurality of transistors Tx1, Tx2, Rx, Dx, and Sx and a plurality of wires may be provided on the first surface 2a. A well region PW may be provided on the photoelectric conversion part PD. In example embodiments, the well region PW may be doped with p-type impurities. Shallow device isolation layers STI may be provided on the well region PW to define active regions AR of the transistors Tx1, Tx2, Rx, Dx, and Sx. The shallow device isolation layer STI may be formed to have a depth smaller than the deep device isolation layer 11. In example embodiments, the shallow device isolation layer STI and the deep device isolation layer 11 may be connected to each other, thereby constituting or defining a single body or region. For example, as shown in FIG. 3A, the shallow device isolation layer STI and the deep device isolation layer 11 may be formed between the unit pixel regions UP to have an inverted 'T' shape.

In each of the unit pixel regions UP, the transfer gate TG serving as the gate electrode of the transfer transistor Tx1 may be provided on the first surface 2a of the substrate 2. A gate insulating layer 24 may be interposed between the transfer gate TG and the substrate 2. A top surface of the transfer gate TG may be higher than the first surface 2a of the substrate 2, and a bottom surface thereof may be positioned in the substrate 2 or the well PW. For example, the transfer gate TG may include a protruding portion 21 positioned on the substrate 2 and a buried portion 22 inserted into the substrate 2. The floating diffusion region FD may be formed in a portion of the substrate 2 between an upper sidewall of the buried portion 22 and the shallow device isolation layer STI. The floating diffusion region FD may be doped with impurities having a different conductivity type from that of the well region PW. For example, the floating diffusion region FD may be doped with n-type impurities.

A doped ground region 26 may be formed in a portion of the active region AR, which is spaced apart from the transfer gate TG by the shallow device isolation layer STI. The doped ground region 26 may be doped with impurities having the same conductivity type as that of the well region PW. For example, the doped ground region 26 may be doped with p-type impurities. In example embodiments, an impurity concentration of the doped ground region 26 may be higher than that of the well region PW. The floating diffusion region FD and the doped ground region 26 may be electrically connected to at least one of contact plugs and wires 30 that are disposed on the first surface 2a. The first surface 2a may be covered with a plurality of interlayered insulating layers 32.

An anti-reflecting layer 38 may be formed to cover wholly the second surface 2b. In each of the unit pixel regions UP, a color filter 42 and a micro-lens 44 may be provided on the anti-reflecting layer 38. The color filter 42 may be a portion of a color filter array including a plurality of color filters arranged in the form of matrix. In example embodiments, the color filter array may be provided to form the Bayer pattern including a red filter, a green filter, and a blue filter; however, embodiments of the present inventive concept are not limited to particular filter colors. For example, in other embodiments, the color filter array may be configured to include a yellow filter, a magenta filter and a cyan filter. In certain embodiments, the color filter array may further include a white filter.

FIGS. 4A through 9A are sectional views taken parallel to the line A-A' of FIG. 2 to illustrate a process of fabricating the image sensor of FIG. 2, and FIGS. 4B through 9B are sectional views taken parallel to the line B-B' of FIG. 2 to illustrate a process of fabricating the image sensor of FIG. 2.

Figure 4A:
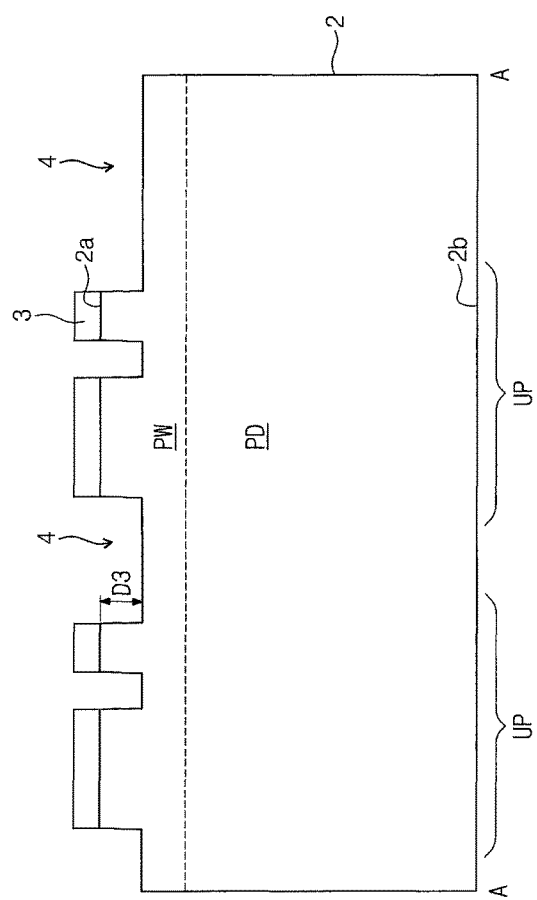
Figure 4B:
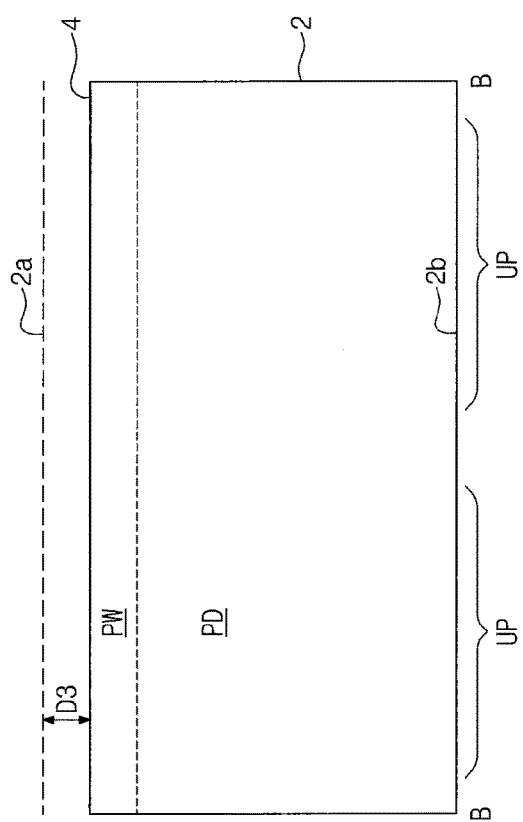

Referring to FIGS. 4A and 4B, the substrate 2 including first and second opposing surfaces 2a and 2b is prepared. The substrate 2 may be a silicon wafer, a silicon-on-insulator (SOI) substrate, and/or a substrate including a semiconductor epitaxial layer. The substrate 2 may be doped with, for example p-type impurities. An ion implantation process may be performed to form the photoelectric conversion part PD and the well region PW in the substrate 2. The photoelectric conversion part PD may be doped with, for example, n-type impurities, and the well region PW may be doped with, for example, p-type impurities. The photoelectric conversion part PD and/or the well region PW may be formed after the formation of the pixel separation portion 12 is complete. A first mask pattern 3 may be formed on the first surface 2a. The substrate 2 adjacent to the first surface 2a may be etched using the first mask pattern 3 as an etch mask, thereby forming the first trench 4 with a first depth D3.

Figure 5A:
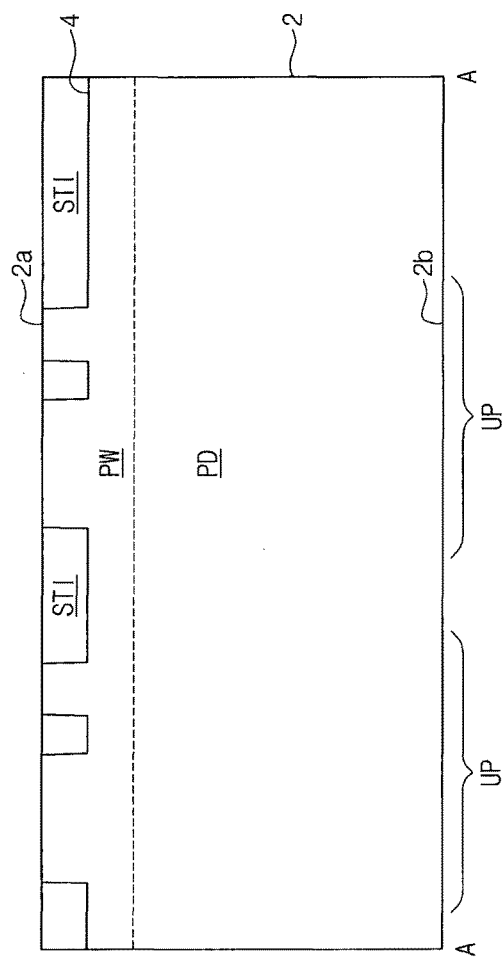
Figure 5B:
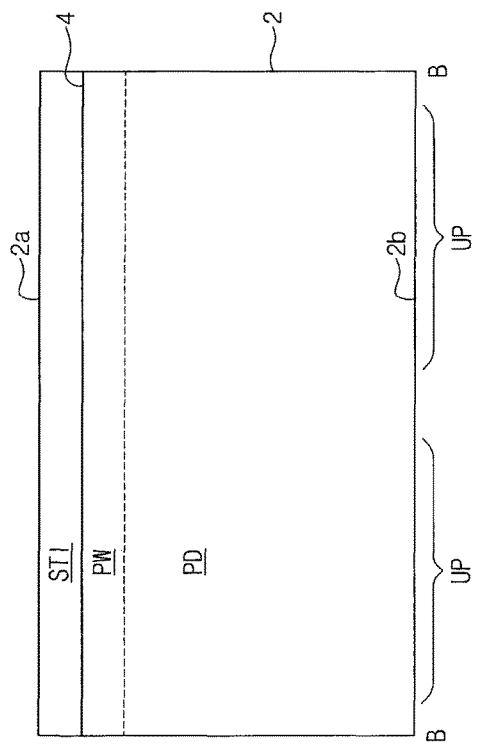

Referring to FIGS. 5A and 5B, an insulating layer is formed to fill the first trench 4 and is planarized to expose the first surface 2a and the shallow device isolation layer STI.

Figure 6A:
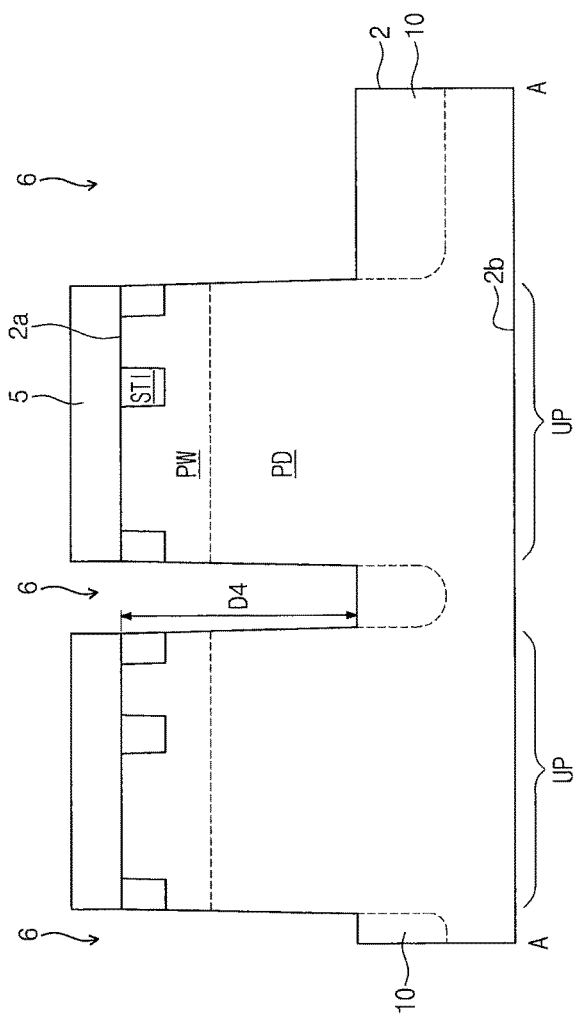
Figure 6B:
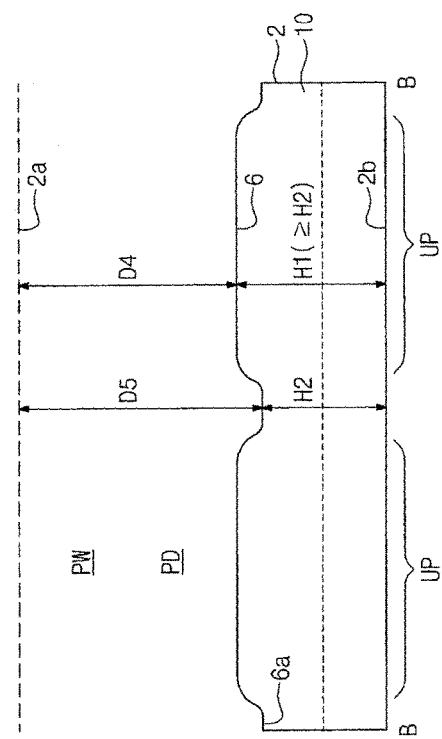

Referring to FIGS. 6A and 6B, a second mask pattern 5 may be formed to cover the first surface 1a and define the pixel regions UP. The shallow device isolation layer STI and the substrate 2 may be etched using the second mask pattern 5 as an etch mask to form the second trench 6 having a second depth D4. The second trench 6 may be formed to include a plurality of grooves intersecting to each other, thereby having a grid- or mesh-like shape in plan view. Here, an amount of the substrate 2 that is etched is greater at an intersection between four adjacent pixel regions UP than between two adjacent pixel regions UP. That is, the etch amount of the substrate 2 may be larger at the intersection of the grooves, when compared with at each of the grooves. Accordingly, at this stage, the second trench 6 may have a third depth D5 that is equivalent to or greater than the second depth D4. Further, the second trench 6 may have a curved or uneven bottom surface. For example, a distance from the second surface 2b to the bottom surface of the second trench 6 may be a first height H1 between two adjacent unit pixel regions UP and a second height H2, which is equivalent to or smaller than the first height H1, between four adjacent unit pixel regions UP. An ion implantation process P1 may be performed to the substrate 2 covered with the second mask pattern 5, and thus, the channel-stop region 10 may be formed in portions of the substrate 2 exposed by the second trench 6. The channel-stop region 10 may be doped with, for example, p-type impurities.

Figure 7A:
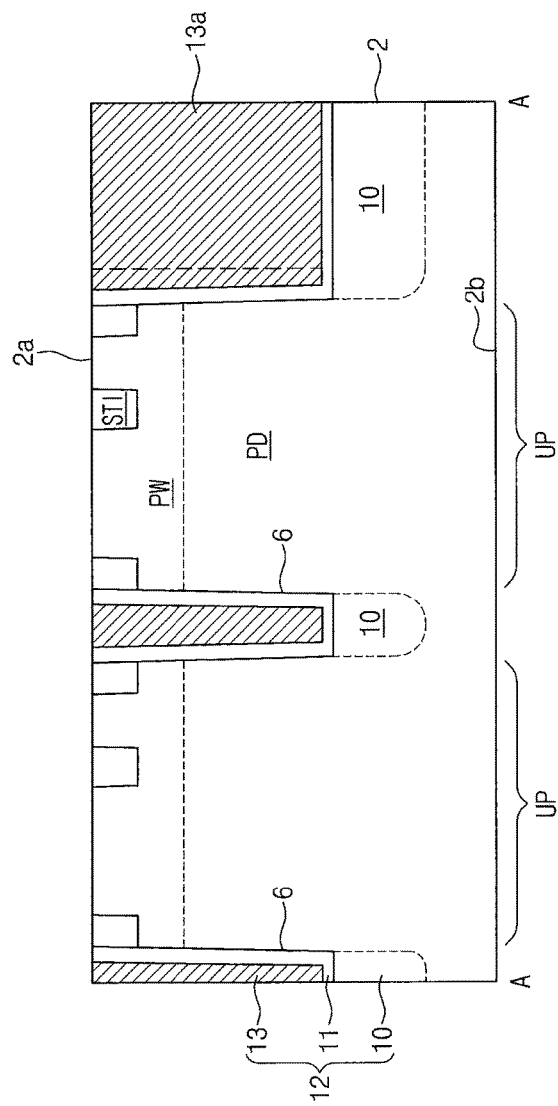
Figure 7B:
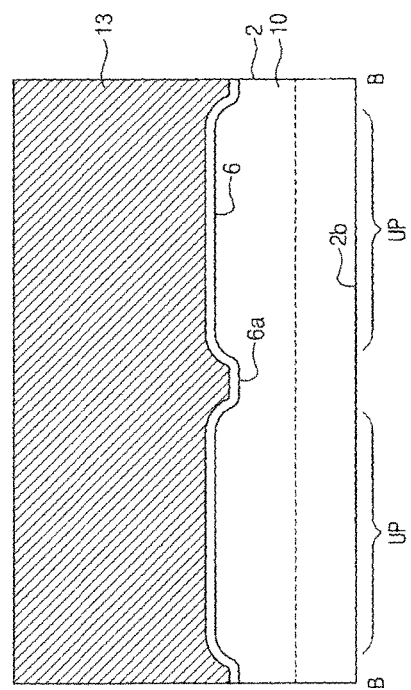

Referring to FIGS. 7A and 7B, the second mask pattern 5 may be removed, and then, the insulating layer 11 may be conformally deposited to cover the side and bottom surfaces of the second trench 6. The conductive layer 13 may be deposited to fill the second trench 6. A planarization process may be performed to expose the first surface 2a, and thus, the deep device isolation layer 11, the common bias line 13, and the line-shaped edge 13a may be formed in the second trench 6. As a result, the pixel separation portion 12 including the deep device isolation layer 11, the channel-stop region 10, and the common bias line 13 may be formed to separate the unit pixel regions UP from each other.

Figure 8A:
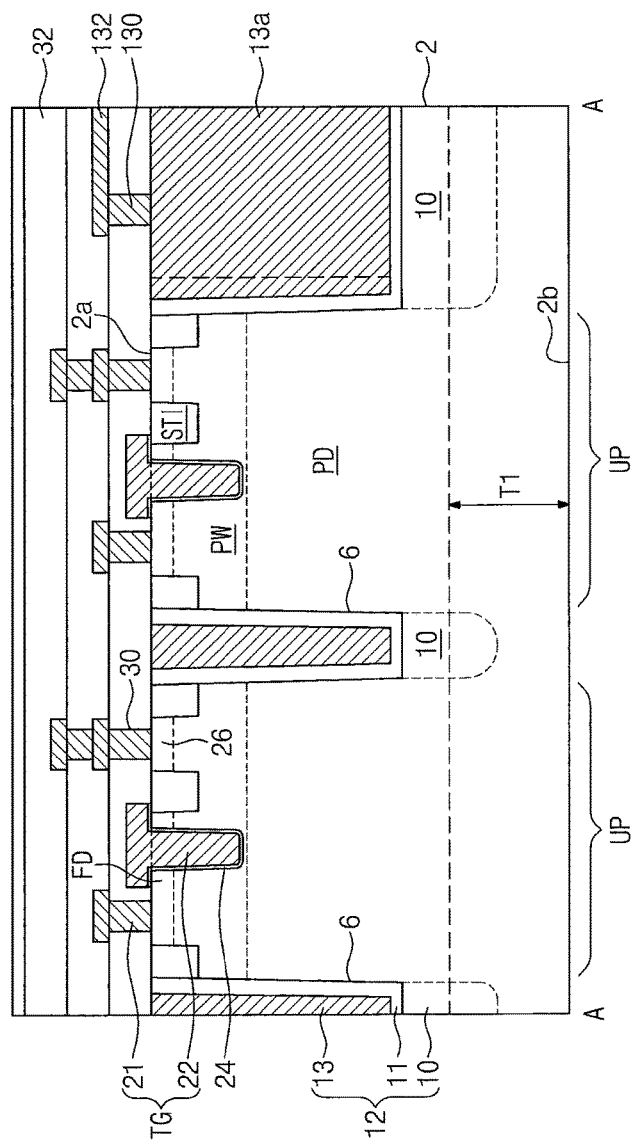

Referring to FIGS. 8A and 8B, the gate insulating layer 24 and the transfer gate TG may be formed on the first surface 2a, and the floating diffusion region FD and the doped ground region 26 may be formed. The contact plugs and wires 30 and the interlayered insulating layers 32 may be formed on the first surface 2a. In example embodiments, the edge contact 130 and the external-voltage-applying wire 132, which are connected to the line-shaped edge 13a, may be formed using the process of forming the contact plugs and wires 30.

Referring to FIGS. 8A, 8B, 9A, and 9B, the substrate 2 may be inverted or rotated in such a way that the second surface 2b faces upward. A grinding or CMP process may be performed to remove a portion of the substrate 2 adjacent to the second surface 2b by a first thickness T1 and thereby to expose the channel-stop region 10. Meanwhile, a variation in depth of the bottom surface of the deep device isolation layer 11 may be determined by that of the second trench 6. Thus, if the pixel separation portion 12 included only the deep device isolation layer 11, the polished surface of the substrate 2 (after the grinding or CMP process) may have a deteriorated surface flatness or uniformity, owing at least to the variation in depth of the bottom surface of the deep device isolation layer 11. Further, during the grinding or CMP process, a stress may be exerted to an interface between the substrate 2 and the deep device isolation layer 11 to create many defects. The deterioration in surface uniformity or the increase of defects may result in increased variation in color between pixels or a deteriorated dark current property. In contrast, according to example embodiments of the inventive concept, the grinding or CMP process may be perform to expose the channel-stop region 10, not the deep device isolation layer 11, and thus, it is possible to improve the surface uniformity and reduce the number of defects in the grinding or CMP process. As a result, it is possible to realize the image sensor with an improved dark current property and a high image quality.

Thereafter, as shown in FIGS. 3A and 3B, the anti-reflecting layer 38, a first insulating layer 39, a second insulating layer 40, the color filter 42, and the micro-lens 44 may be formed on the second surface 2b of the substrate 2.

Figure 10:
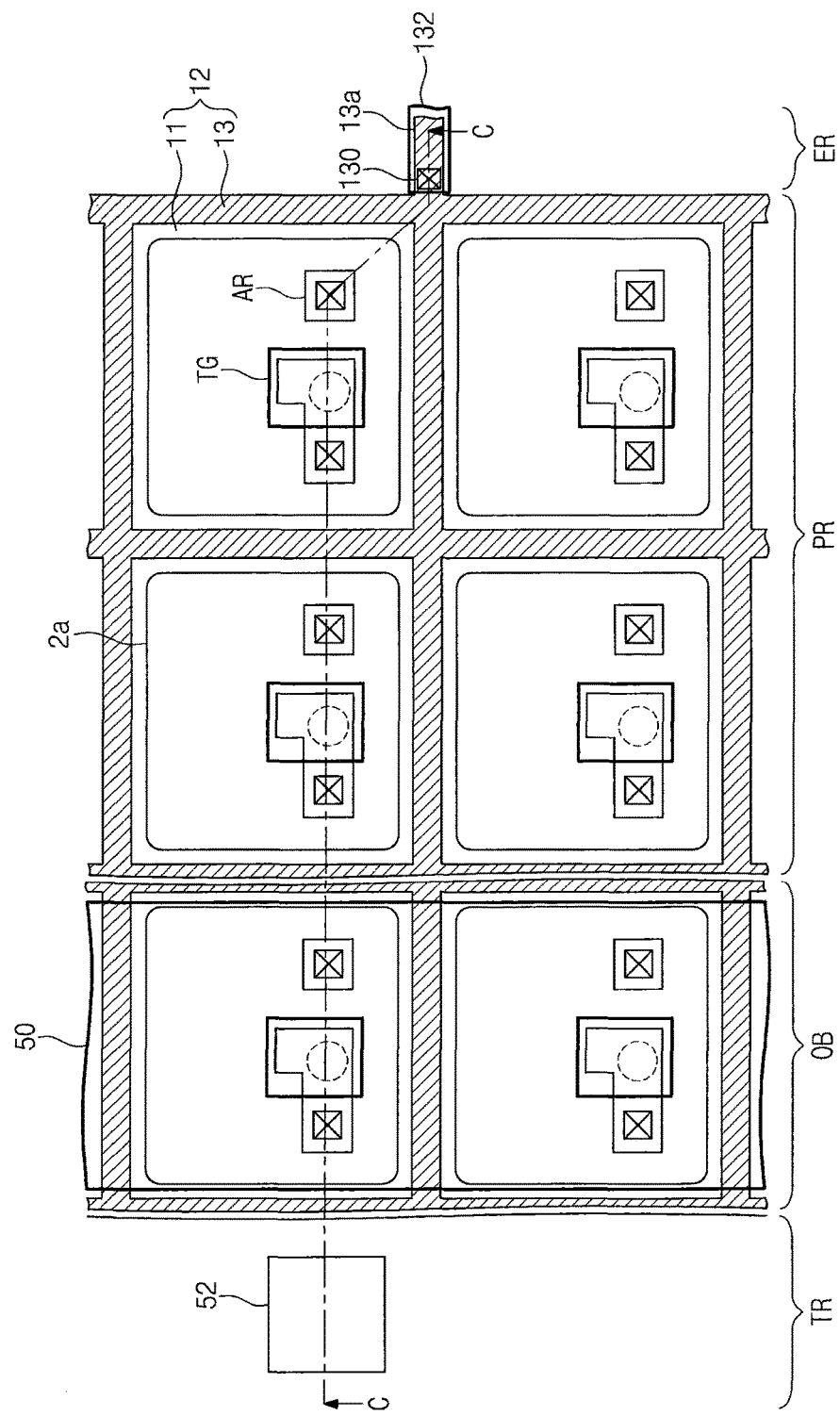
FIG. 10 is a layout illustrating an image sensor according to other example embodiments of the inventive concept.
Figure 11:
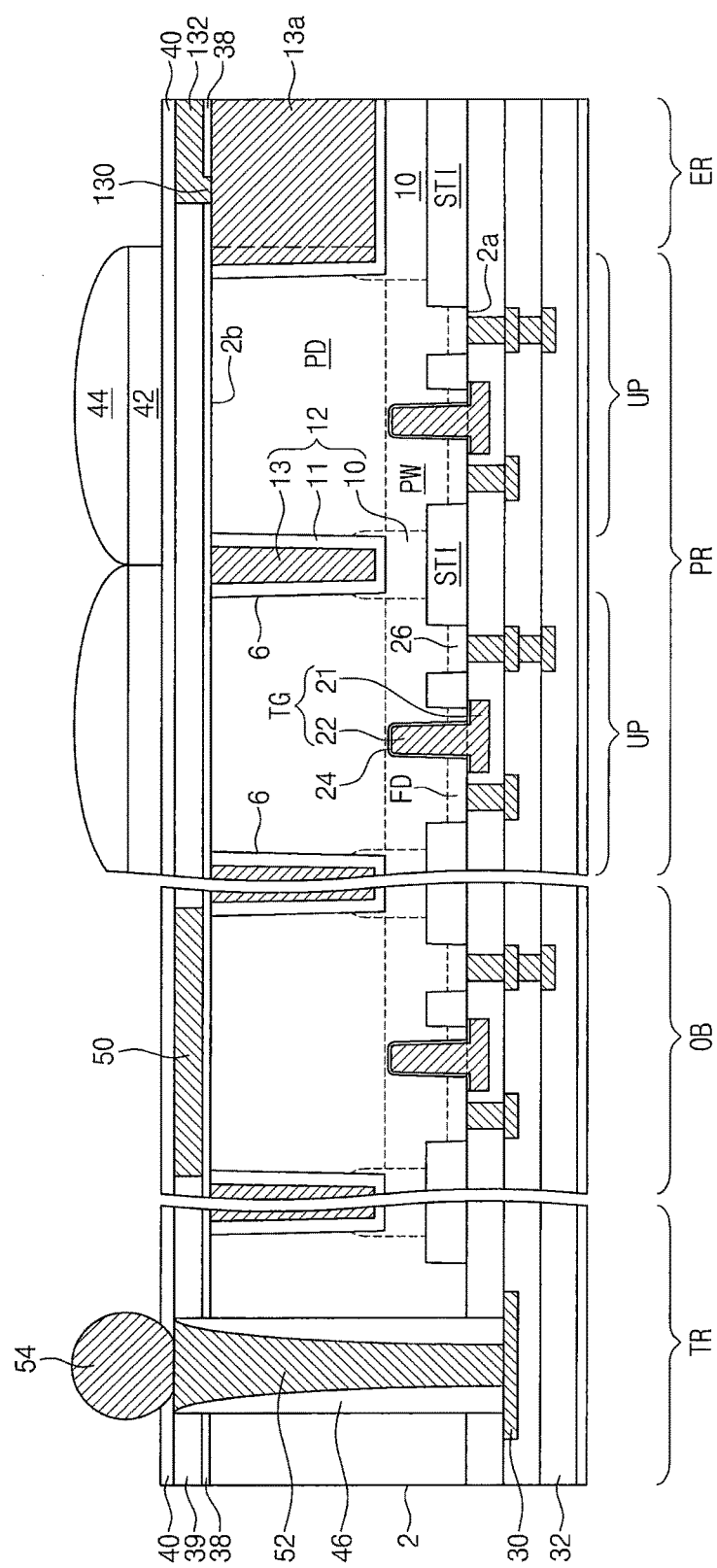
FIG. 11 is a sectional view taken along a line C-C' of FIG. 10 to illustrate the image sensor according to other example embodiments of the inventive concept.

FIG. 10 is a layout illustrating an image sensor according to other example embodiments of the inventive concept. FIG. 11 is a sectional view taken along a line C-C' of FIG. 10 to illustrate the image sensor according to other example embodiments of the inventive concept.

Referring to FIGS. 10 and 11, according to other example embodiments of the inventive concept, the image sensor may include the substrate 2 with the pixel region PR, the optical black region OB, the pad region TR, and the edge region ER. The unit pixel regions UP may be provided in the pixel region PR, and the optical black region OB and the pad region TR may be provided spaced apart from the pixel region PR. The line-shaped edge 13a may be provided in the edge region ER. The pixel separation portion 12 may include the deep device isolation layer 11, the common bias line 13, the channel-stop region 10, and the shallow device isolation layer STI. In example embodiments, the deep device isolation layer 11 may be provided in contact with the second surface 2b and spaced apart from the first surface 2a. The channel-stop region 10 may be provided between the shallow device isolation layer STI and the deep device isolation layer 11. Each or at least one of the deep device isolation layer 11 and the common source line 13 may have a curved or uneven bottom surface. An optical black pattern 50 may be provided on the optical black region OB. A through via 52 may be provided in the pad region TR to penetrate the first insulating layer 39, the anti-reflecting layer 38, and the substrate 2. An insulating spacer 46 may be interposed between the through via 52 and the substrate 2. A solder ball 54 may be attached to the through via 52. The edge contact 130 and the external-voltage-applying wire 132 may be provided in the first insulating layer 39 of the edge region ER to be in contact with the line-shaped edge 13a. The through via 52, the optical black pattern 50, and the external-voltage-applying wire 132 may be formed of the same material (e.g., tungsten) in some embodiments.

The optical black pattern 50 may reduce or prevent light from being incident on or into a reference pixel provided thereunder. Since the reference pixel is in the light-blocking state, an amount of electric charges generated in the reference pixel (hereinafter, referred as to a reference charge amount) can be used to compare an amount of electric charges from the unit pixel regions UP (hereinafter, referred as to a unit charge amount), and to calculate a difference between the unit and reference charge amounts. This may make it possible to obtain more accurate signals from each unit pixel UP.

Except for the above described differences, the image sensor according to other example embodiments of the inventive concept may be configured to have substantially similar features as those of the previously-described embodiments.

FIGS. 12 through 17 are sectional views illustrating a process of fabricating the image sensor of FIG. 11.

Figure 12:
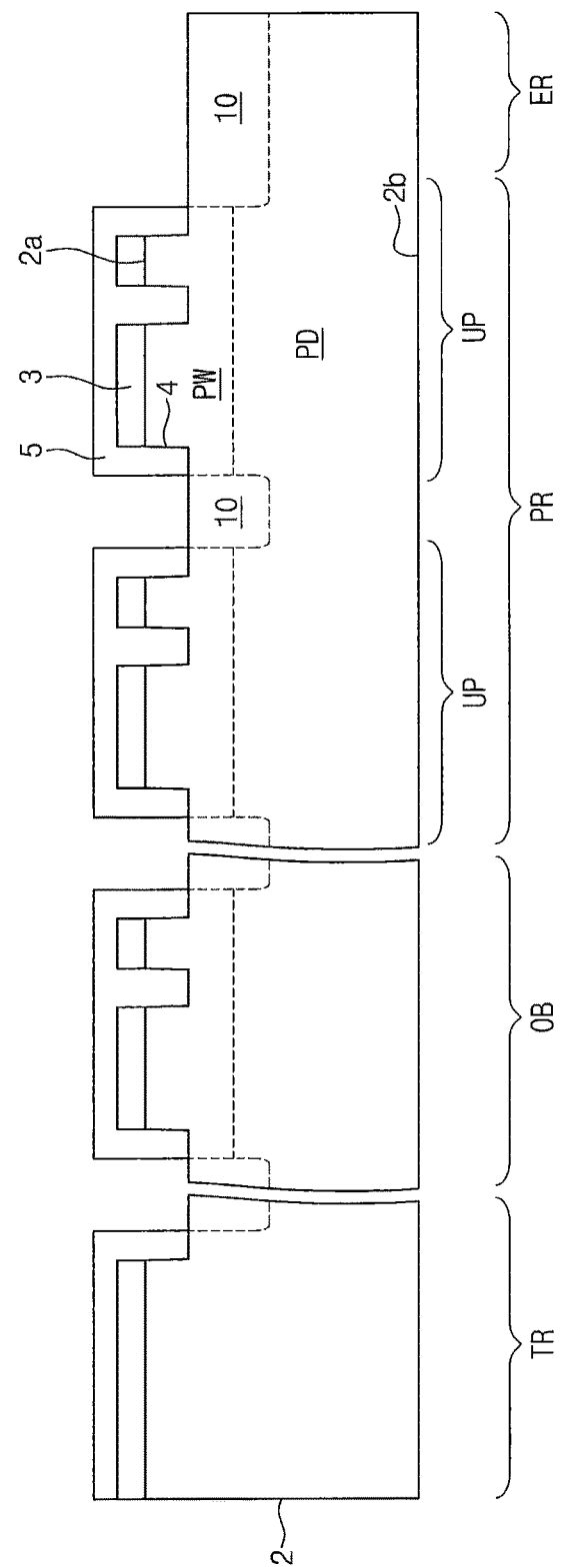
FIGS. 12 through 17 are sectional views illustrating a process of fabricating the image sensor of FIG. 11.

Referring to FIG. 12, the first trench 4 may be formed, as shown in FIG. 4A, and then, the second mask pattern 5 may be formed to cover the first mask pattern 3 and define a region for the channel-stop region 10. The substrate 2 may be doped with impurities using the second mask pattern 5 as an ion injection mask to form the channel-stop region 10. The channel-stop region 10 may be doped with, for example, p-type impurities.

Figure 13:
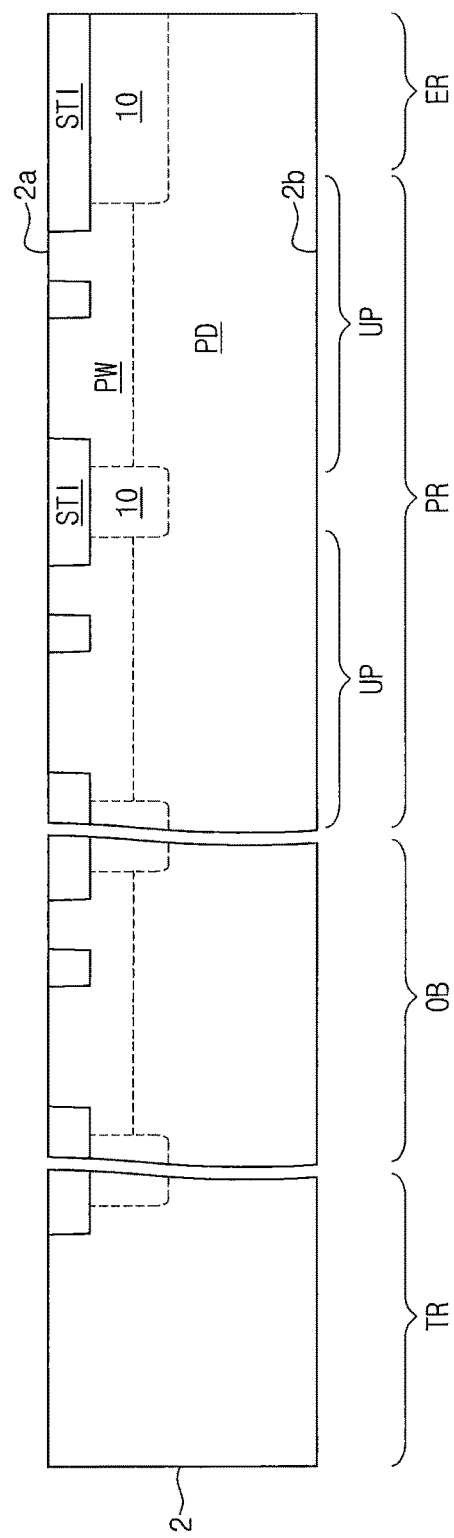

Referring to FIG. 13, the first and second mask patterns 3 and 5 may be selectively removed to expose the first trench 4. An insulating layer may be deposited to fill the first trench 4, and then, the insulating layer may be etched to form the shallow device isolation layer STI having a flat or planar top surface.

Figure 9A:
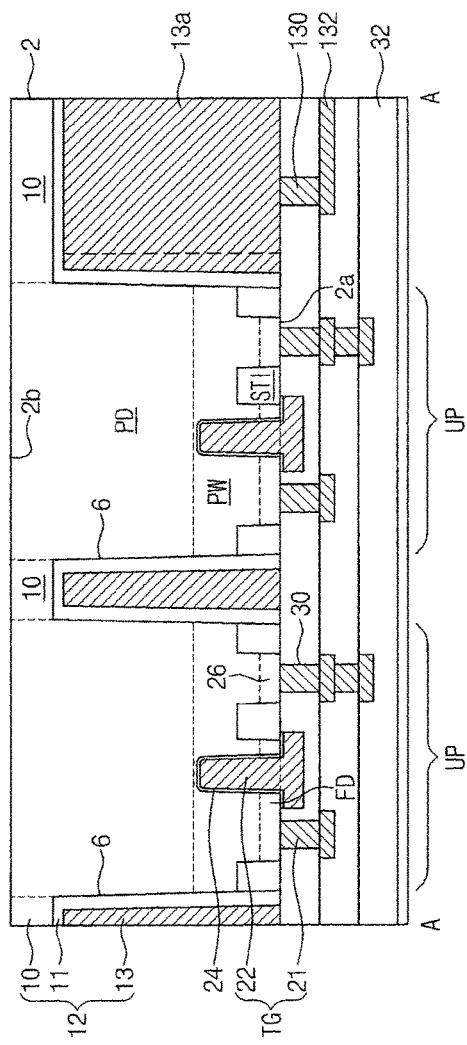
Figure 9B:
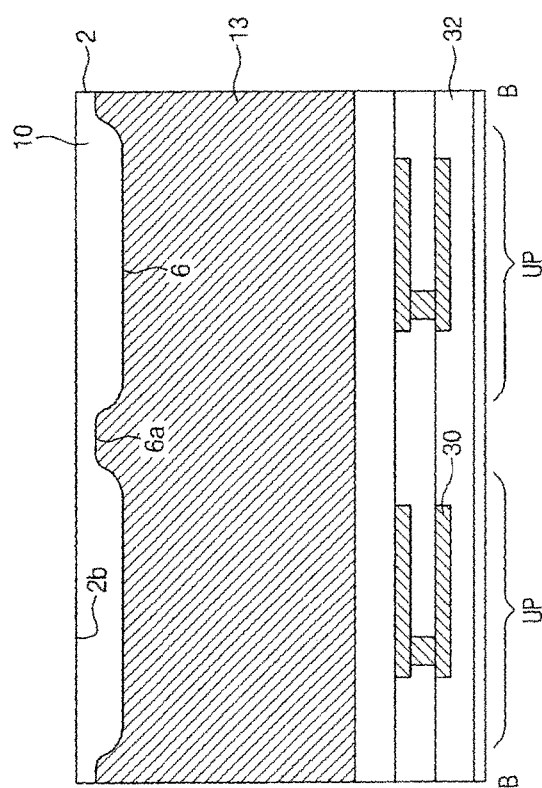
Figure 14:
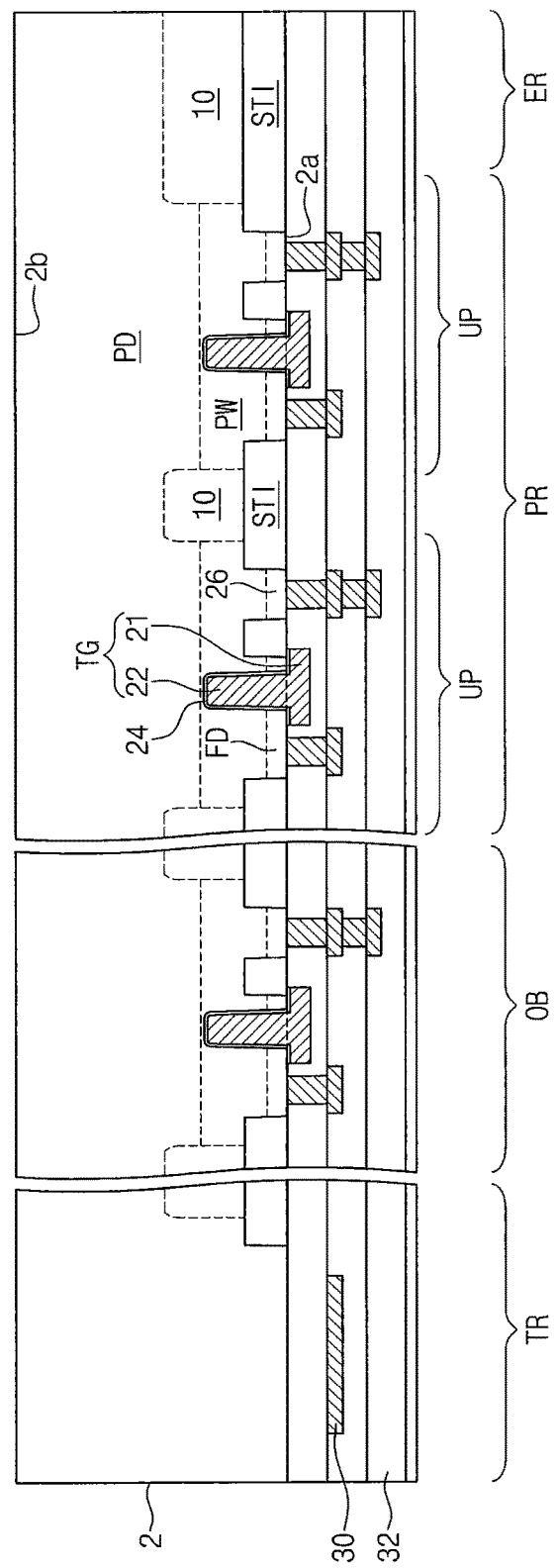

Referring to FIG. 14, as described with reference to FIG. 9A, the gate insulating layer 24, the transfer gate TG, the floating diffusion region FD, the doped ground region 26, the contact plugs and wires 30, and the interlayered insulating layers 32 may be formed on or in the first surface 2a of the substrate 2. In contrast to FIG. 9A, the edge contact 130 and the external-voltage-applying wire 132 may not be formed at this stage.

Figure 15:
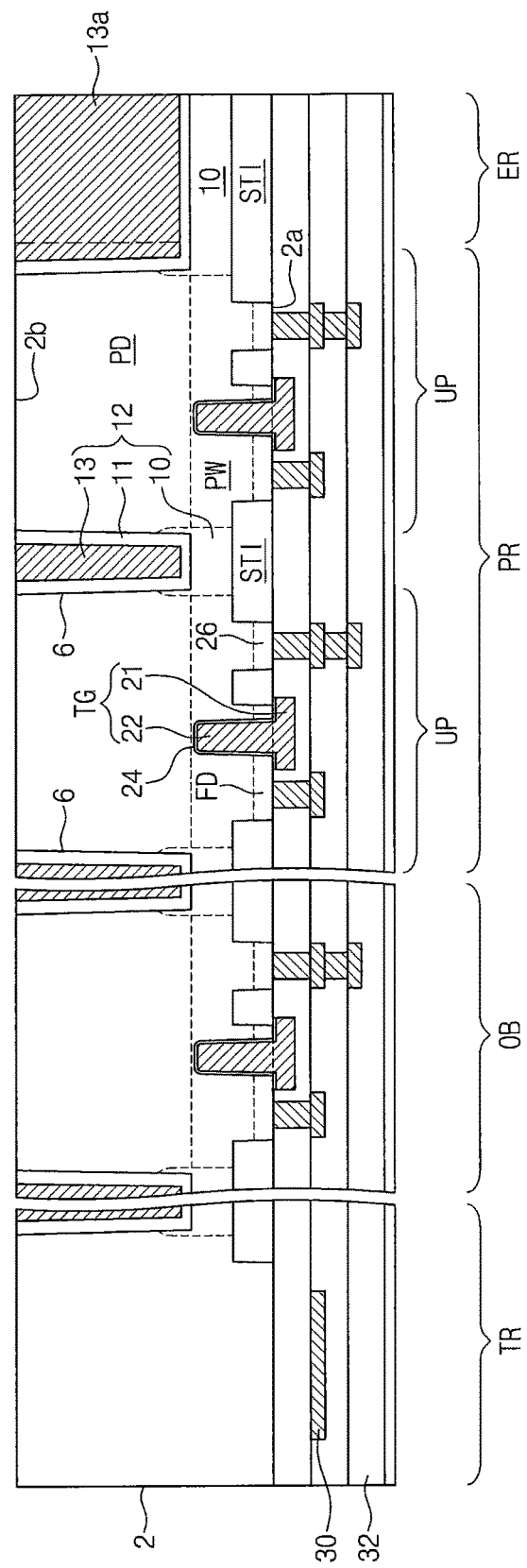

Referring to FIG. 15, the substrate 2 may be inverted or turned-over, and a grinding or CMP process may be performed to remove a portion of the substrate 2 adjacent to the second surface 2b by a predetermined thickness. Here, the deep device isolation layer 11 may not be exposed during the grinding or CMP process, and thus, it is possible to reduce or prevent a polished surface of the substrate from having a reduced or lowered flatness or uniformity and to suppress surface defects from occurring. A portion of the substrate 2 adjacent to the second surface 2b may be etched to form the second trench 6 exposing the channel-stop region 10. Thereafter, an insulating layer and a conductive layer may be sequentially formed to fill the second trench 6, and may be planarized to form the deep device isolation layer 11, the common bias line 13, and the line-shaped edge 13a. Due to the presence of the channel-stop region 10, it is possible to reduce a depth of the second trench 6, which may make it possible to prevent or suppress an etch damage from occurring.

Figure 16:
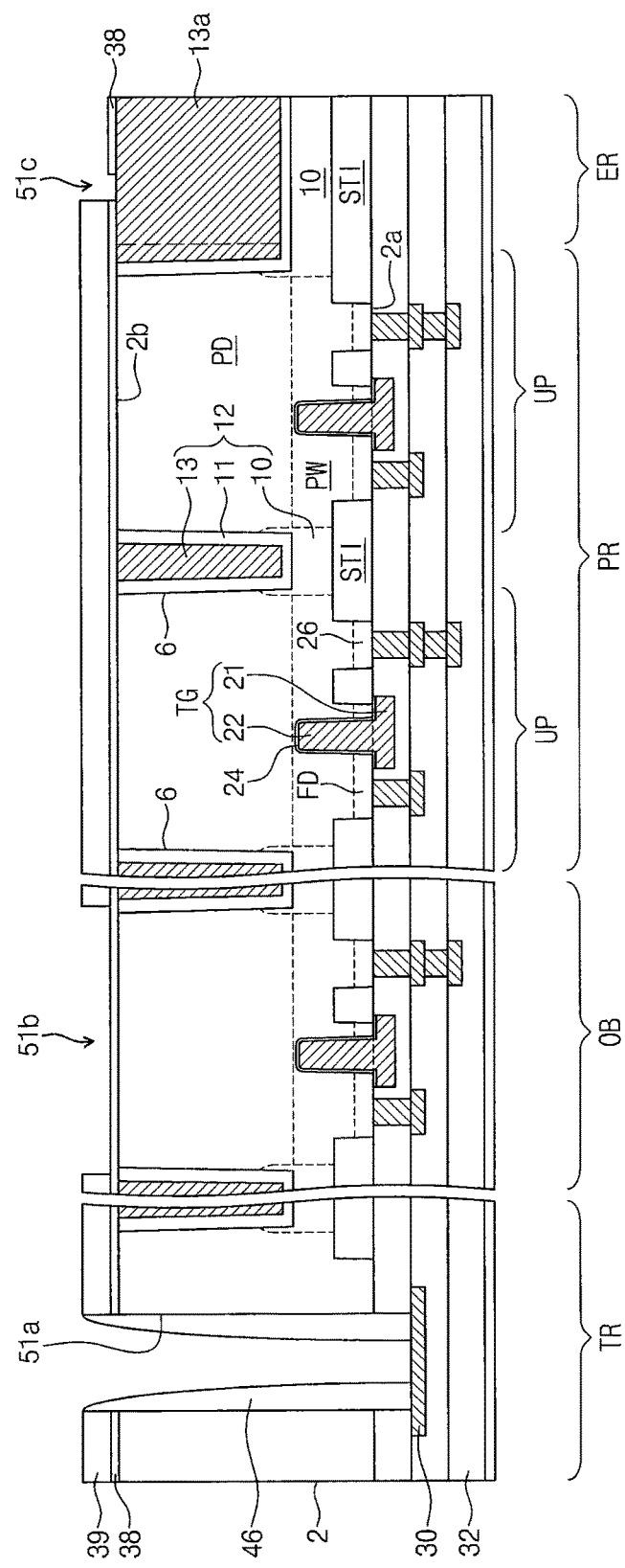

Referring to FIG. 16, the anti-reflecting layer 38 and the first insulating layer 39 may be sequentially stacked on the second surface 2b. The first insulating layer 39, the anti-reflecting layer 38, and the substrate 2 may be patterned to form a through-via hole 51a exposing the wire 30 on the pad region TR. The first insulating layer 39 may be patterned to form a first recess region 51b on the optical black region OB. The first insulating layer 39 and the anti-reflecting layer 38 may be patterned to form a second recess region 51c on the edge region ER.

Figure 17:
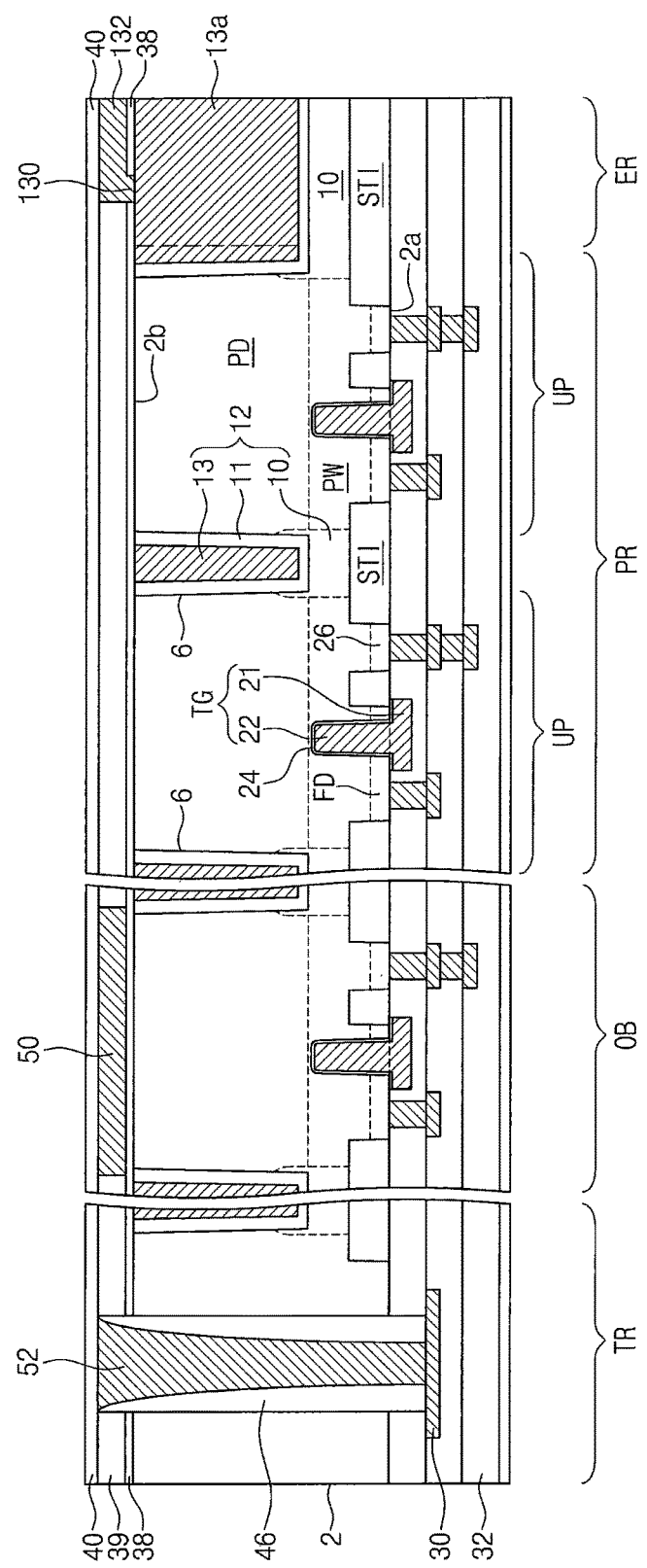

Referring to FIG. 17, a conductive layer may be deposited and planarized to form the through via 52, the optical black pattern 50, and the edge contact and external-voltage-applying wire 130 and 132 filling the through-via hole 51a, the first recess region 51b, and the second recess region 51c, respectively.

Subsequent processes may be performed in the same or similar manner as that described in example embodiments of the inventive concept.

Figure 18:
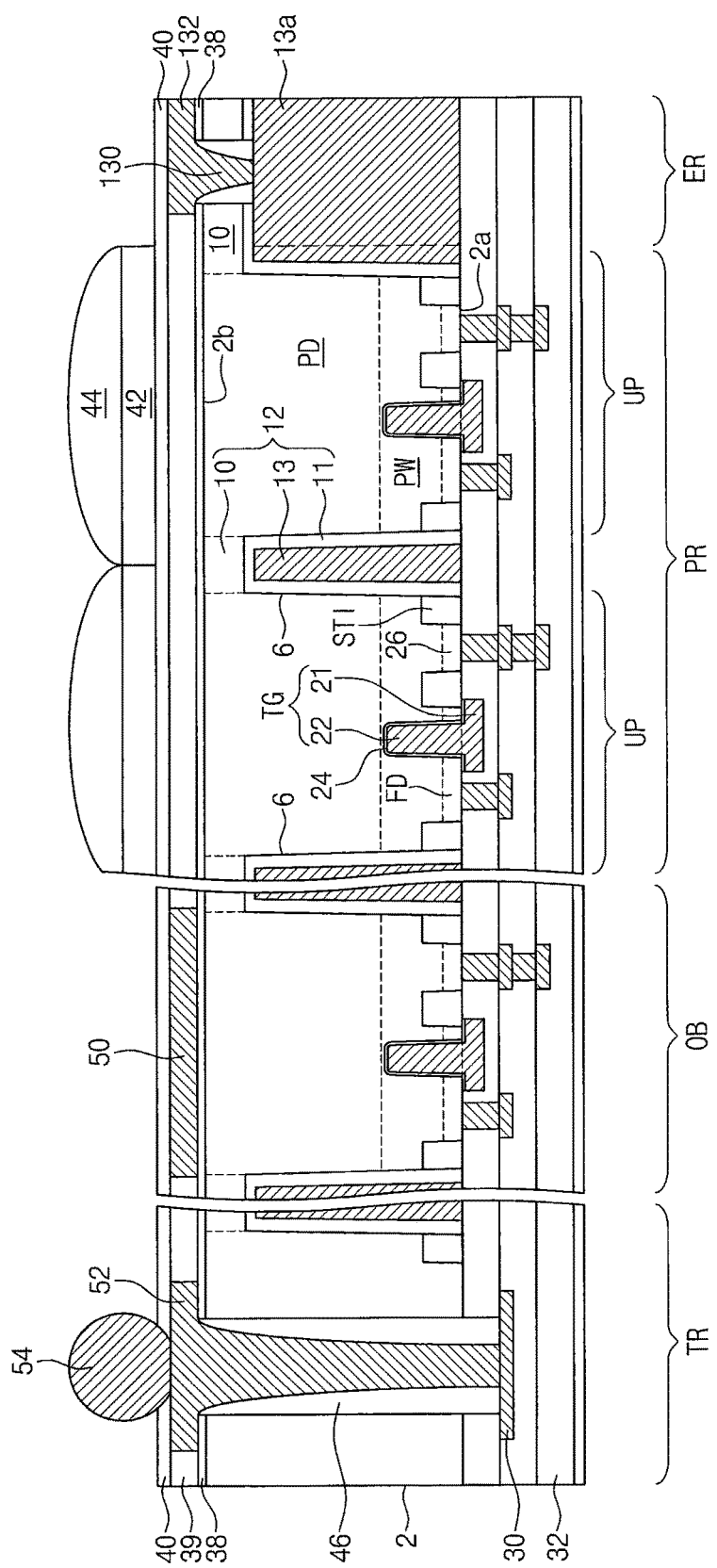
FIG. 18 is a sectional view taken along a line C-C' of FIG. 10 to illustrate an image sensor according to still other example embodiments of the inventive concept.

FIG. 18 is a sectional view taken along a line C-C' of FIG. 10 to illustrate an image sensor according to still other example embodiments of the inventive concept.

Referring to FIG. 18, structural features of the image sensors according to the aforementioned embodiments may be combined to realize an image sensor according to still other example embodiments of the inventive concept. For example, according to still other example embodiments of the inventive concept, the image sensor may be configured to include the pixel separation portion 12, whose structure is similar to that of FIGS. 3A and 3B, and the edge contact 130 and the external-voltage-applying wire 132, whose disposition is similar to that of FIG. 11.

Figure 19:
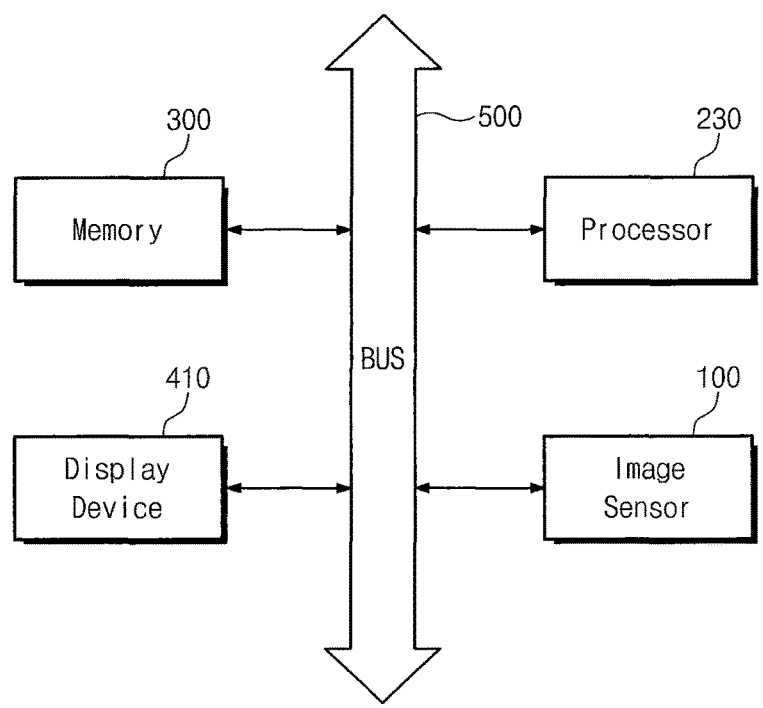
FIG. 19 is a block diagram illustrating an electronic device including an image sensor, according to example embodiments of the inventive concept.

FIG. 19 is a block diagram illustrating an electronic device having an image sensor, according to example embodiments of the inventive concept. The electronic device may be any of various types of devices, such as a digital camera or a mobile device, for example. Referring to FIG. 19, an illustrative digital camera system includes an image sensor 100, a processor 230, a memory 300, a display 410 and a bus 500. As shown in FIG. 19, the image sensor 100 captures an external image under control of the processor 230, and provides the corresponding image data to the processor 230 through the bus 500. The processor 230 may store the image data in the memory 300 through the bus 500. The processor 230 may also output the image data stored in the memory 300, e.g., for display on the display device 410.

Figure 20:
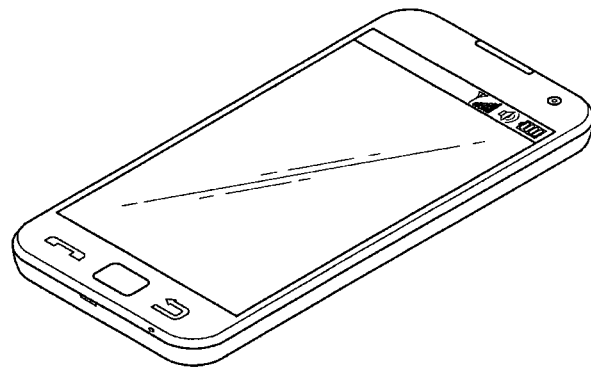
FIGS. 20 through 24 show examples of multimedia devices, to which image sensors according to example embodiments of the inventive concept can be provided.
Figure 21:
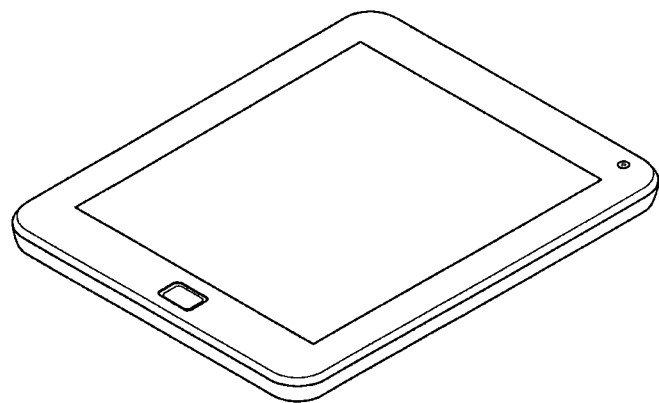
Figure 22:
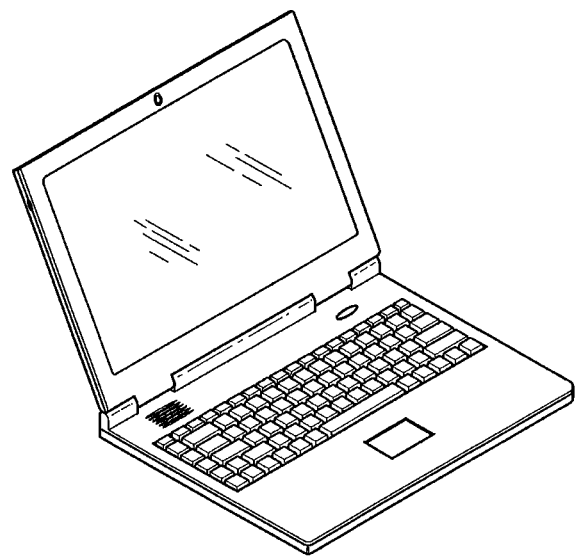
Figure 23:
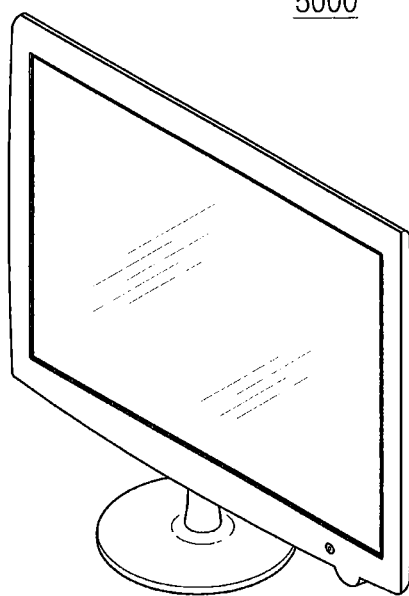
Figure 24:
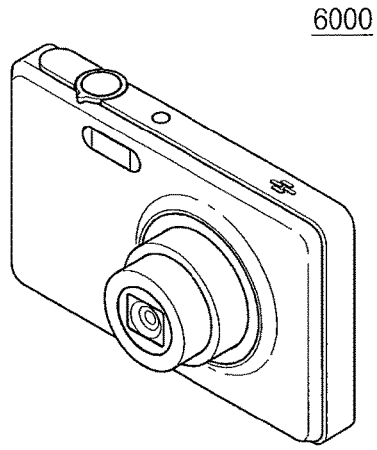

FIGS. 20 through 24 show examples of multimedia devices, to which image sensors according to example embodiments of the inventive concept can be applied. Image sensors according to example embodiments of the inventive concept can be applied to a variety of multimedia devices with an imaging function. For example, image sensors according to example embodiments of the inventive concept may be applied to a mobile phone or a smart phone 2000 as shown in FIG. 20, to a tablet PC or a smart tablet PC 3000 as shown in FIG. 21, to a laptop computer 4000 as shown in FIG. 22, to a television set or a smart television set 5000 as shown in FIG. 23, and/or to a digital camera or a digital camcorder 6000 as shown in FIG. 24.

According to example embodiments of the inventive concept, the image sensor may include a common bias line, to which a negative voltage can be applied, and which is disposed in a deep device isolation layer. Accordingly, it may be possible to fix or otherwise attract holes in a sidewall of deep device isolation layer and thereby improve a dark current property of the image sensor.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating an image sensor, comprising:
   forming a pixel separation structure in a substrate to define pixel regions, the substrate having a first surface and a second surface opposite the first surface, wherein the second surface is arranged to receive incident light and wherein the pixel separation structure comprises a common bias line and a device isolation layer on the common bias line and extends from the first surface towards the second surface but not completely through the substrate; and
   forming a photoelectric conversion part and a gate electrode in or on each of the pixel regions.

2. The method of claim 1, wherein the forming the pixel separation structure comprises:
   etching a portion of the substrate adjacent the first surface to form a trench;
   forming the device isolation layer to conform to side and bottom surfaces of the trench; and
   forming the common bias line to fill the trench.

3. The method of claim 1, wherein the forming the pixel separation structure comprises:
   etching a portion of the substrate adjacent the second surface to form a trench;

forming the device isolation layer to conform to side and bottom surfaces of the trench; and forming the common bias line to fill the trench.

4. The method of claim 3, wherein the substrate further comprises an optical black region spaced apart from the pixel regions, and wherein the method further comprises:

forming an insulating layer to cover the second surface; and forming an optical black pattern in the insulating layer on the optical black region and an external-voltage-applying wire connected to the common bias line.

5. The method of claim 3, wherein the substrate further comprises a pad region spaced apart from the pixel regions, and wherein the method further comprises:

forming an insulating layer to cover the second surface; and forming a through via and an external-voltage-applying wire, wherein the through via extends into the insulating layer and the pad region of the substrate, and the external-voltage-applying wire is connected to the common bias line.

6. The method of claim 3, further comprising forming a channel stop region between the device isolation layer and the second surface of the substrate.

7. The method of claim 6:

wherein forming the channel stop region comprises:

forming a trench in the substrate; and implanting ions in the substrate through the bottom of the trench to form the channel stop region; and wherein forming the pixel separation structure comprises forming the device isolation layer and the common bias line in the trench.

8. A method of forming an image sensor, the method comprising:

forming a trench that extends into a substrate from a first side of the substrate and that defines a plurality of pixel regions in the substrate;

forming a device isolation layer conforming to a bottom and side walls of the trench;

forming a conductive bias line in the device isolation layer in the trench;

thinning the substrate by removing a portion of the substrate on a second side of the substrate without exposing the device isolation layer; and forming an optical layer structure on the second side of the substrate.

9. The method of claim 8, further comprising forming a channel stop region in the substrate between the bottom of the trench and a surface of the substrate on the second side of the substrate.

10. The method of claim 9, wherein forming the channel stop region comprises implanting ions into the substrate at the bottom of the trench before forming the device isolation layer.

11. The method of claim 9, wherein thinning the substrate by removing a portion of the substrate on a second side of the substrate without exposing the device isolation layer comprises exposing the channel stop region.

* * * * *